United States Patent [19]

Fujimori

[11] Patent Number: 5,729,232
[45] Date of Patent: Mar. 17, 1998

[54] COMBINATION SHARED CAPACITOR INTEGRATOR AND DIGITAL-TO-ANALOG CONVERTER CIRCUIT WITH DATA DEPENDENCY CANCELLATION

[75] Inventor: Ichiro Fujimori, Kanagawa, Japan

[73] Assignees: Asahi Kasei Microsystems Ltd., Tokyo, Japan; Oasis Design, Inc., Austin, Tex.

[21] Appl. No.: 630,436

[22] Filed: Apr. 10, 1996

[51] Int. Cl.$^6$ .................................................. H03M 1/66
[52] U.S. Cl. ........................ 341/172; 341/150; 341/143
[58] Field of Search ................................ 341/143, 155, 341/139, 150, 118, 120, 172

[56] References Cited

U.S. PATENT DOCUMENTS

| | | |
|---|---|---|
| 4,851,841 | 7/1989 | Sooch . |
| 5,323,158 | 6/1994 | Ferguson, Jr. ............... 341/143 |
| 5,412,387 | 5/1995 | Vincelette et al. . |
| 5,451,950 | 9/1995 | Vincelette et al. ............ 341/150 |

OTHER PUBLICATIONS

Ribner, et al., "A Third–Order Multi Stage Sigma–Delta Modulator With Reduced Sensitivity to Nonidealities", IEEE Journal of Solid–State Circuits, vol. 26, No. 12 (Dec. 1991), pp. 1764–1774.

Harris, Steven, "How to Achieve Optimum Performance from Delta Sigma A/D and D/A Converters", J. Audio Eng. Soc. vol. 41, No. (Oct. 1993), pp. 782–790.

*Primary Examiner*—Jeffrey A. Gaffin
*Assistant Examiner*—Peguy JeanPierre
*Attorney, Agent, or Firm*—Kevin L. Daffer; Conley, Rose & Tayon

[57] ABSTRACT

A modulator, in conjunction with a load circuit, is provided. The modulator forms part of an A/D converter system. The modulator includes a series of switched capacitors connected in a shared capacitor arrangement. The shared capacitors receive samples from an input signal and, depending upon the logic value fed into a D/A converter, the shared capacitor further receives a feedback reference voltage. The reference voltage is thereby coupled to the switched capacitor network, as well as to a load circuit which cancels data-dependent values modulated upon the reference voltage supply. The load circuit thereby serves to eliminate ac components within the reference voltage supply resulting from data dependent loading.

27 Claims, 4 Drawing Sheets

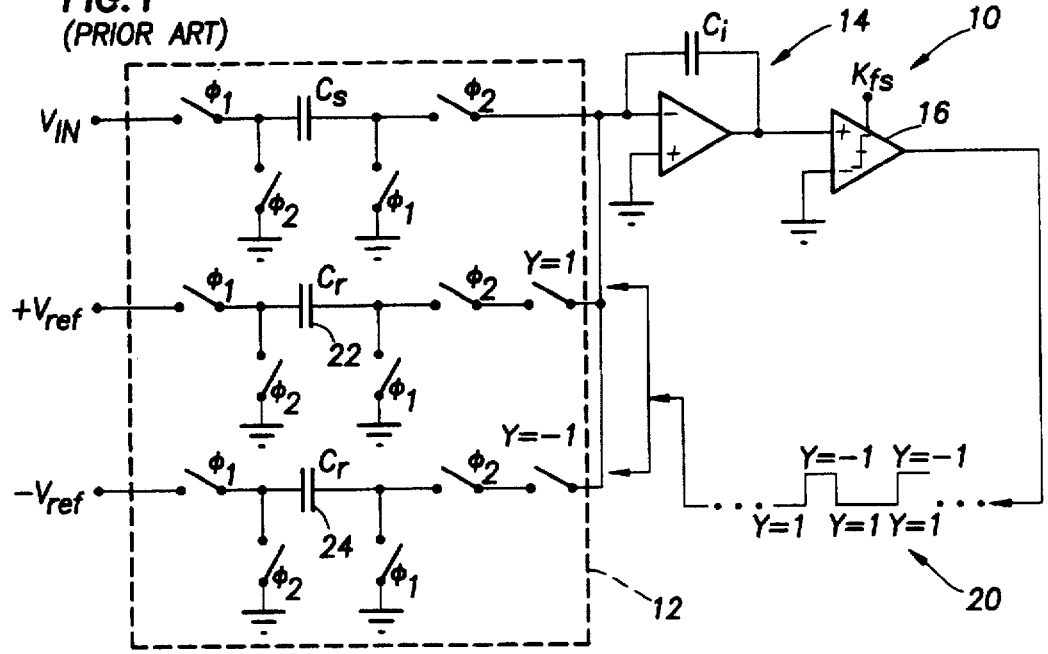
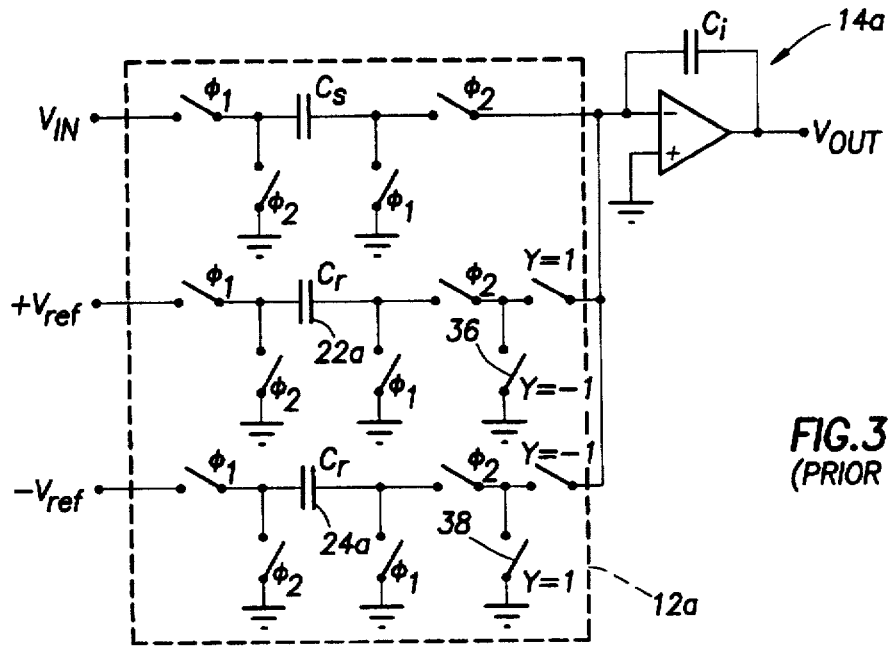

COMBINATION SHARED CAPACITOR INTEGRATOR AND DIGITAL-TO-ANALOG CONVERTER CIRCUIT WITH DATA DEPENDENCY CANCELLATION

BACKGROUND OF THE INVENTION

1. Field of the Invention

This invention relates to a mixed signal system and, more particularly, to a network of shared capacitors which combines at its input an analog signal with a digital-to-analog (D/A) output. The analog signal voltages ($V_{in}+$ and $V_{in}-$), as well as the reference voltages ($V_{ref}+$ and $V_{ref}-$) chosen as a result of a quantizer output, are selectively forwarded into a data dependency cancellation circuit simultaneous with their input into the shared capacitors. The data dependency cancellation circuit, or load circuit, serves to cancel digital and analog data dependency loading effects as seen by the $V_{ref}+$ and $V_{ref}-$ voltage supplies.

2. Description of the Relevant Art

Integrated circuits which embody both analog and digital circuitry on the same monolithic substrate are well known. Examples of such integrated circuits include circuits which convert digital to analog signals and analog to digital signals. A circuit for converting analog to digital signals is herein referred to as an A/D converter. A popular A/D converter employs a delta-sigma modulator, often referred to as an "oversampled" modulator. As a mixed signal circuit, a delta-sigma modulator contains both analog and digital circuitry in a feedback loop. The delta-sigma modulator oversamples an incoming analog signal at a rate much greater than the Nyquist sample rate, and converts the analog signal to a one-bit digital bit stream.

A delta-sigma modulator employed within an A/D converter serves to manipulate the noise spectrum of the analog input signal so that most of the noise power, commonly referred to as quantization noise is moved to frequencies substantially outside the signal bandwidth. This is referred to as noise shaping. A filter can then readily be used to reduce the out-of-band shaped quantization noise to acceptable levels.

A delta-sigma modulator found within an A/D circuit typically includes a network of switched capacitors. The switched capacitors serve to periodically sample the input signal as well as a reference voltage source. Sampling includes periodically charging one or more of the switched capacitors from the input voltage and/or reference voltage. Periodic sampling is often termed "charge loading".

After being charge loaded, the switched capacitors are thereafter discharged (or "dumped") onto a summing node. Using an A/D converter example, a sampled analog input signal is typically combined with a sampled reference voltage during a subsequent discharge period. The combined, or summed, samples are then forwarded from the summing node onto an integrator. When included within a modulator loop, the integrator has a high pass effect on the noise component (i.e., quantization noise). For this reason, the switched capacitors, in conjunction with the integrator, serves as a noise shaping filter.

A clearer understanding of switched capacitors and the effect input and reference voltages have upon those capacitors is provided in the exemplary oversampled A/D modulator shown in FIG. 1. Modulator 10 is indicative of a modulator employed within an A/D converter. The A/D example is only one of many uses for modulator 10. Description of the various components of the exemplary modulator 10 help provide an understanding of loading problems associated with modulator functionality.

Modulator 10 includes three sub-components: a switched capacitor network 12, an integrator 14, and a quantizer 16. Switched capacitors 12 function to selectively sample an input signal ($V_{in}$) and reference voltages ($\pm V_{ref}$) at periodic intervals. After sampling, capacitors 12 discharge their charge loaded voltages upon integrator 14. Charge loading and charge dumping is controlled in accordance with various clock cycles $\phi 1$ and $\phi 2$. Times in which either $+V_{ref}$ or $-V_{ref}$ are forwarded onto integrator 14 are controlled by the current value on digital bit stream 20. For example, a logic low value within bit stream 20 causes a Y=1 closure of Y=1 switch (i.e., selection of $+V_{ref}$). Conversely, a Y=-1 logic value will cause closure of the Y=-1 switch. Capacitors 22 and 24, and switches associated with those capacitors, implement a one-bit D/A converter function which is controlled by bit stream 20. The logic value of bit stream 20 therefore determines whether $+V_{ref}$ or $-V_{ref}$ will be selected for summation with $V_{in}$ during clock $\phi 2$.

While switched capacitors 12 serve to charge and discharge capacitors $C_s$ and $C_r$, integrator 14 performs analog noise-shaping, the output of which is forwarded onto quantizer 16. Quantizer 16 is somewhat different from analog integrator 14 in that quantizer 16 produces a digital output shown as bit stream 20.

A problem occurs during the time in which switched capacitors 12 are discharged onto integrator 14. Any pre-existing charge on capacitors $C_r$ effect the loading of $V_{ref}$ when $V_{ref}$ is sampled during the next clock cycle. For example, a Y=1 data value causes discharge of capacitor 22 during $\phi 2$ clock cycle. At the same time, however, capacitor 24 remains charged since a Y=-1 value cannot occur simultaneous with Y=1. At the next sampling phase $\phi 1$, $+V_{ref}$ must replenish the charge of capacitor 22, while $-V_{ref}$ does not have to provide any additional charge. The load presented to the $+V_{ref}$ or $-V_{ref}$ supply can therefore vary depending upon the sequence of data values supplied by bit stream 20. Loading upon either $+V_{ref}$ or $-V_{ref}$ is thereby termed "data dependent loading".

There are two forms of data dependent loading. As shown above, loading upon $+V_{ref}$ and $-V_{ref}$ supplies is depending upon the digital bit stream. This form of data dependent loading is herein classified as digital data dependency. However, there is another form of data dependency, often referred to as analog data dependency. Analog data dependency upon $V_{ref}$ is directly caused by changes in the analog input voltage $V_{in}$.

FIG. 2 illustrates loading problem on $+V_{ref}$ or $-V_{ref}$ supplies, and an attempt to remove those problems. In particular, load 26 is shown indicative of times in which clock $\phi 1$ occurs and sampling, or charge loading, occurs upon capacitor $C_r$. If charge upon capacitor $C_r$ remains during a subsequent clock $\phi 2$, then load 28 appears. Load 28 is modeled as capacitor $C_r$ being a current source 30 of pre-existing charge fed through a load 32. Current source 30, fed through resistor 32, causes a loading upon $V_{ref}$ supply. Accordingly, $V_{ref}$ (actual)=$V_{ref}$(ideal)-$R_{load} \times I_{load}$. $R_{load}$ is the resistance value of resistor 32, wherein resistor 32 represents the output resistance of $V_{ref}$ supply. $I_{load}$ is the current value of source 30. Since $I_{load}$ is proportional to Y (either Y=1 or Y=-1), then $V_{ref}$ is proportional to Y. As such, a conventional switched capacitor one-bit D/A converter implementation 12 causes capacitive loading upon $V_{ref}$ and therefore modulation of $V_{ref}$ by Y.

It is important to avoid data dependency and, more specifically, $V_{ref}$ modulation/loading. Any modulation of $V_{ref}$ by an ac component near the higher end in which the quantization noise can exist (i.e., $f_s/2$) will cause modulator 10 to modulate the quantization noise back to passband (i.e., near dc). For example, if $V_{in}$ is exactly at the middle of the peak-to-peak range, then the duty cycle $Y_1$ is fifty percent, which means that the ac component upon $V_{ref}$ will be near $f_s/2$. It is therefore important to minimize data dependency loading on $V_{ref}$ so as to help eliminate the problems of imputed inband noise upon the modulator. The problem of ac components formed upon $V_{ref}$ voltage supplies, and the effect of the ac component upon the passband spectrum appears well known, and is documented in an article to S. Harris, "How to Achieve Optimum Performance from Delta-Sigma A/D and D/A Converters", *J. Audio Eng. Soc. Vol.* 41, No. 10 (October 1993), pp. 782–790 (herein incorporated by reference).

Attempts have been made to eliminate data dependent loading, and the problems of ac components on $V_{ref}$. For example, many researchers have employed additional discharge circuitry within the switched capacitor network. FIG. 3 depicts such circuitry, wherein switched capacitor network 12a is shown having discharge switches 36 and 38 added thereto. Switches 36 and 38 serve to remove any charge on capacitor $C_r$ which is not being used. More specifically, switches 36 and 38 cause discharge to ground of a capacitor not selected for discharge upon the summing node of integrator 14a. If, for example, the value on capacitor 22a is being dumped to the summing node, then any sampled $-V_{ref}$ voltage on capacitor 24a will be discharged to ground, or vice versa. Switches 36 and 38 prove beneficial in equalizing the load on $+V_{ref}$ with respect to $-V_{ref}$ regardless of the input digital data value used in selecting Y=1 or Y=–1 switches. The technique in FIG. 3 is fairly well recognized, and is described in U.S. Pat. No. 4,851,841 (herein incorporated by reference).

Although data dependent loading is substantially eliminated from the configuration shown in FIG. 3, switched capacitor network 12a is more difficult to implement due to the relatively large quantity of switches needed. Addition of discharge switches 36 and 38 to the already numerous switches only enhances the timing difficulty and control sequences needed for such a structure. It would therefore be desirable to employ a less complex switched capacitor network having fewer switches and fewer capacitors than that shown in FIGS. 1 and 3. A less complex arrangement is shown in reference to FIG. 4.

FIG. 4 illustrates relevant portions of a modulator 40, which employs an improved switched capacitor network 12b. Switched capacitor network 12b utilizes fewer capacitors and fewer switches than networks 12 or 12a. More specifically, network 12b embodies a single "shared capacitor" $C_s$ rather than three capacitors. Shared capacitor $C_s$ not only can sample $V_{in}$, but is shared to also sample $+V_{ref}$ or $-V_{ref}$. Using a single shared capacitor not only minimizes the capacitive area on the integrated circuit, but more importantly, ensures there is no gain error between the analog input signal $V_{in}$ and the referenced supply voltage $\pm V_{ref}$ chosen by the D/A path.

For reasons of economy and performance, it is desirable to employ a shared capacitor configuration; however, problems of data dependency still remain. For example, using the configuration shown in FIG. 4, if Y=–1 then the charge provided to shared capacitor $C_s$ by $+V_{ref}$ is $Q=C_s(V_{ref}-V_{in})$. However, if Y=1 then the charge provided to shared capacitor $C_s$ by $+V_{ref}$ is Q=0.

As shown, data dependency exist in a shared capacitor arrangement based upon any pre-existing charge on $C_s$.

While it would be desirable to utilize a shared capacitor network such as that shown in FIG. 4, improvements must be made to the switched capacitor network which do not impose data dependency problems. A new arrangement must therefore be devised with the benefits of a shared capacitor but without the detriments. A partial solution is shown in reference to FIG. 5.

FIG. 5 illustrates an improved switched capacitor network 12c coupled to the front end of a fully differential integrator 42. Integrator 42 is modeled as a differential amplifier, with differential input signals, coupled in an integration mode. Ideally, output $V_{out}+$ and $V_{out}-$ is entirely independent of the individual signal levels input upon the amplifier. Instead, only the difference between the input signals matters. Network 12c, due to the differential nature of the integrator input, employs more switches than network 12b, but retains the shared capacitor benefits. By utilizing opposite polarities reference voltage supplies (i.e., $V_{ref}+V_{ref}-$), and selectively combining those reference voltage to an analog input voltage of a certain polarity (i.e., $V_{in}+$ or $V_{in}-$), network 12c substantially eliminates digital data dependency.

While digital data dependency is removed, analog data dependency remains. More specifically, the charge provided to shared capacitor 44 by $+V_{ref}$ is equal in magnitude to the charge on shared capacitor 46, and those charges are only dependent upon $V_{in}$, not the value of Y. For example, if Y=–1, then charge on shared capacitor 44 by $+V_{ref}$ is $Q=C_s(V_{ref}-V_{in}+)$. If Y=1, then the charge on capacitor 46 by $+V_{ref}$ is $Q=C_s(V_{ref}-V_{in}-)$. Since $V_{in}+$ does not equal $V_{in}-$, $V_{in}$ dependency is still a problem.

The benefits of using a fully differential integrator in the arrangement shown in FIG. 5 is partially explained in reference to Ribner, et al., "A Third-Order Multi Stage Sigma-Delta Modulator With Reduced Sensitivity To Nonidealities", *IEEE JR. of Solid-State Circuits*, Vol. 26, No. 12 (December 1991), pp. 1764–1774 (herein incorporated by reference). The use of differential signals, a shared capacitor, and a fully differential integrator poses many advances over non-shared capacitor arrangements, or integrators which are not fully differential. However, it would be desirable to use such a system but without the problems of $V_{in}$ dependency.

SUMMARY OF THE INVENTION

The problems outlined above are in large part solved by an improved switched capacitor arrangement. The switched capacitor is one which resides in an A/D system, as part of a modulator. The modulator hereof is used to convert analog input signals. The modulator can be classified as an oversampling modulator, or a delta-sigma modulator. The improved switched capacitor arrangement, in combination with a replicated switched capacitor load, avoids digital and analog data dependency problems.

Both digital and analog data dependency is substantially eliminated by employing a load circuit with the modulator. The load circuit is designed somewhat similar to the modulator, in that it receives reference voltages $\pm V_{ref}$ and input voltages $V_{in}$. The load circuit compensates for any analog voltage loading on the $\pm V_{ref}$ supplies by causing the reference voltage supply to see a counterpart, offsetting analog voltage. The load circuit produces the offsetting analog voltage and thereby serves to prevent any modulation of that voltage back upon the passband of interest.

In the differential integrator embodiment, the load circuit effectively and efficiently cancels $V_{ref}$ loading regardless of the $+V_{in}$ or $-V_{in}$ values established by the modulator upon the $V_{ref}$ supplies. The load circuit, while separate from the modulator, nonetheless receives the same $\pm V_{in}$ and $\pm V_{ref}$ differential signals within a switched capacitor arrangement, matching that of the modulator. Using the benefits of a shared capacitor in conjunction with a fully differential amplifier, the present modulator is therefore attractive in both performance and cost. A load circuit which is coupled, possibly on the same monolithic substrate, as the modulator, comprises a switched capacitor network which serves only to receive reference and analog input voltages, and, more importantly, to match loading caused by the modulator upon the $\pm V_{ref}$ supplies. The switched capacitors of the load circuit employ, relative to the switched capacitors of the modulator, a reverse Y control of $V_{ref}$.

Broadly speaking, the present invention contemplates a modulator, preferably an oversampled type modulator, found within an A/D converter. In an A/D system, the modulator includes a network of switched capacitors set forth as shared capacitors which selectively samples both the input voltage and the reference voltage. A shared capacitor $C_s$ is coupled to sample a first analog input voltage of first polarity (e.g., $V_{in}+$) during a first clock cycle $\phi 1$. The shared capacitor $C_s$ forwards during a second clock cycle $\phi 2$ subsequent to the first clock cycle either +Vref or −Vref depending upon the data value Y. A load circuit is coupled to sample a second analog input voltage of second polarity (e.g., $V_{in}-$) opposite the first polarity during the first clock cycle. The load circuit combines the first and second analog input voltages ($V_{in}-$ and $V_{in}+$) with the reference voltage (either $+V_{ref}$ or $-V_{ref}$) to cancel loading of the first and second input voltages upon the reference voltage.

As a result of the load circuit, the reference voltage loading is entirely independent of the analog input signal, and changes thereto. Further, the load circuit makes charge on the shared capacitor independent of the Y voltage data value. According to one embodiment, there are two logic states or values Y=−1 and Y=1 input to the D/A converter. According to an alternative embodiment, there are three logic states Y=−1, Y=1 and Y=0 input to the D/A converter.

The present invention further contemplates a delta-sigma modulator. The delta-sigma modulator is one which can receive an analog input voltage of positive polarity ($V_{in}+$) to a shared capacitor within the modulator during a first clock cycle $\phi 1$. The delta-sigma modulator is also configured to receive a reference voltage upon the shared capacitor. A load circuit separate from the delta-sigma modulator also receives the input voltage and reference voltage. The load circuit includes a shared capacitor which receives the reference voltage during a second clock cycle $\phi 2$. The load circuit places an offset voltage upon the reference voltage to substantially cancel a data dependency voltage value imparted upon the reference voltage by the analog input voltage. The offset voltage is one of equal magnitude and opposite polarity to the analog input voltage received on the shared capacitor of the modulator. Thus, the load circuit forces an offset voltage which tracks the analog input voltage received by the modulator's shared capacitor. At all times, the load circuit thereby substantially cancels any data dependency load resulting from changes in $V_{in}$.

BRIEF DESCRIPTION OF THE DRAWINGS

Other objects and advantages of the invention will become apparent upon reading the following detailed description and upon reference to the accompanying drawings in which:

FIG. 1 is a schematic diagram of a modulator having a switched capacitor arranged according to a conventional design;

FIG. 2 is a circuit diagram of a modeled reference voltage load during charge load and charge dump cycles;

FIG. 3 is a schematic diagram of a modulator having a switched capacitor network with discharge switches according to a conventional design;

Figure 4:
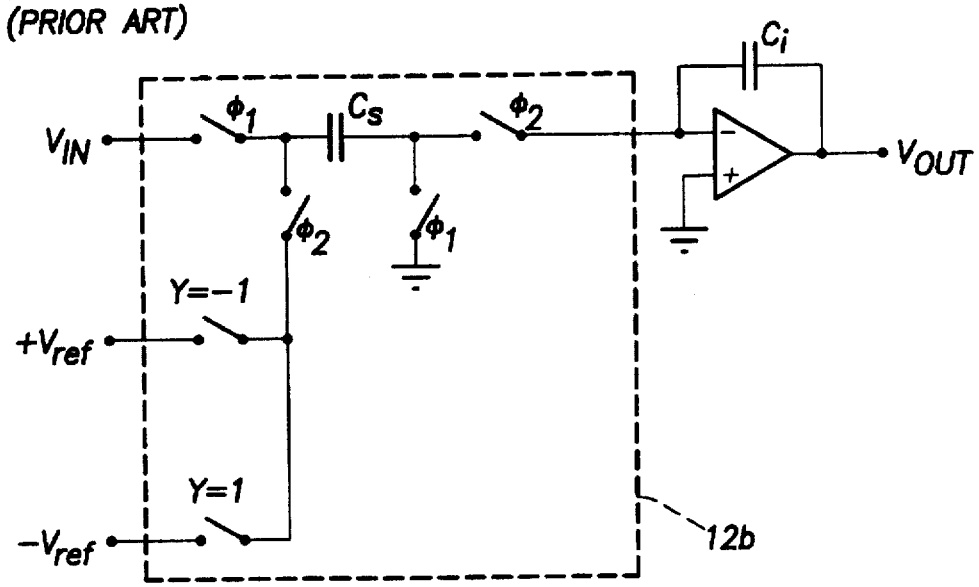
FIG. 4 is a schematic diagram of a modulator having a shared capacitor arrangement according to a conventional design.
Figure 5:
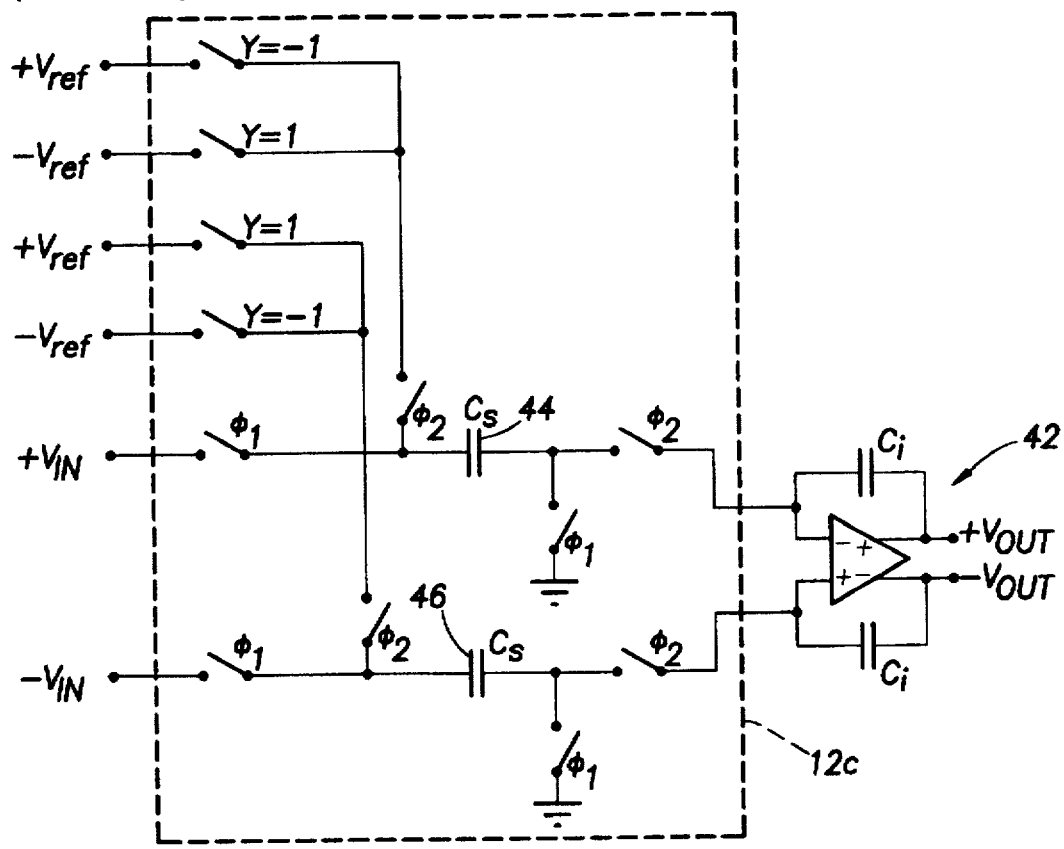
FIG. 5 is a schematic diagram of a modulator having a fully differential integrator and opposite polarity reference and analog input voltages according to a conventional design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 6:
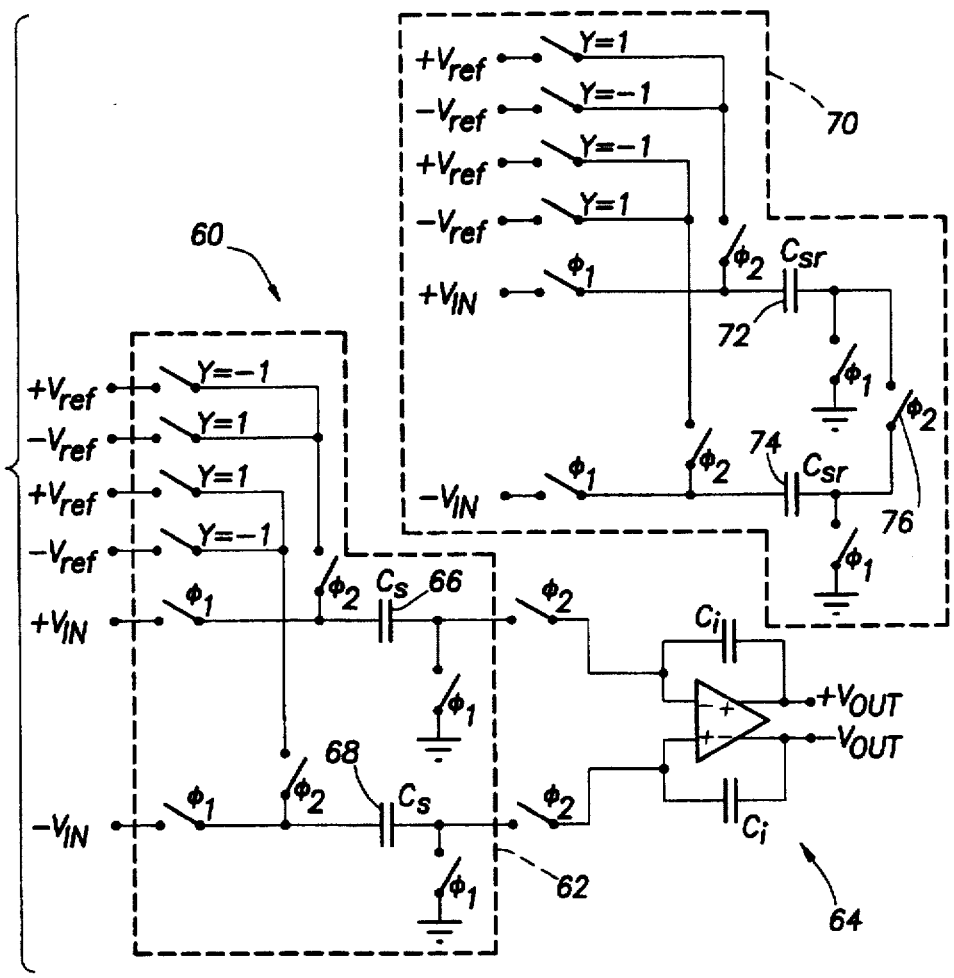
FIG. 6 is a schematic diagram of a modulator circuit and a load circuit coupled to receive the reference and analog voltages and to cancel the data dependent loading of the analog voltages upon the reference voltage supplies.
Figure 7:
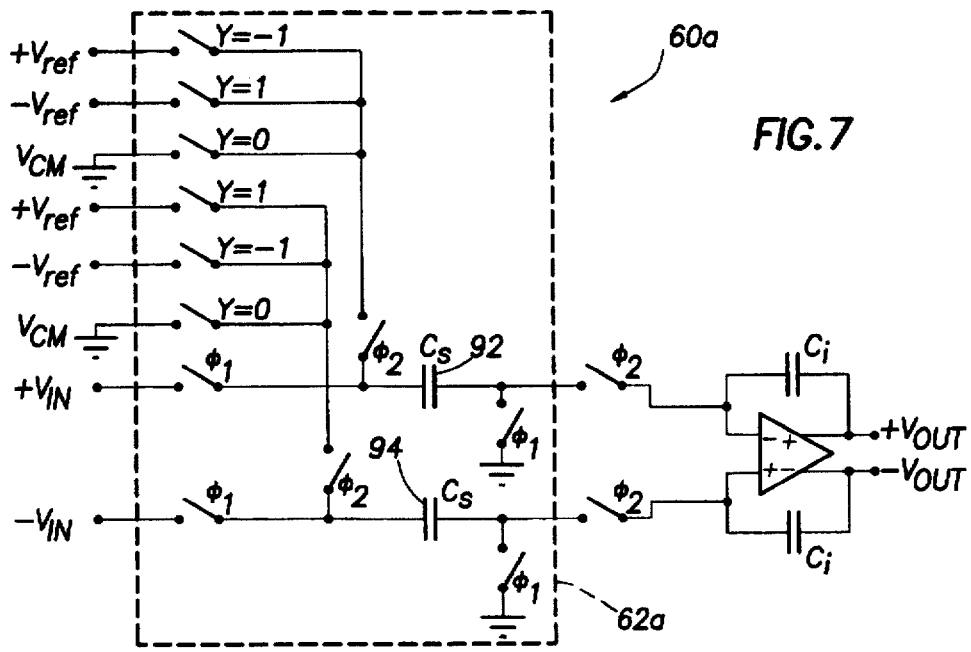
FIG. 7 is the modulator of FIG. 6, according to one embodiment, modified to accept three logic levels.
Figure 8:
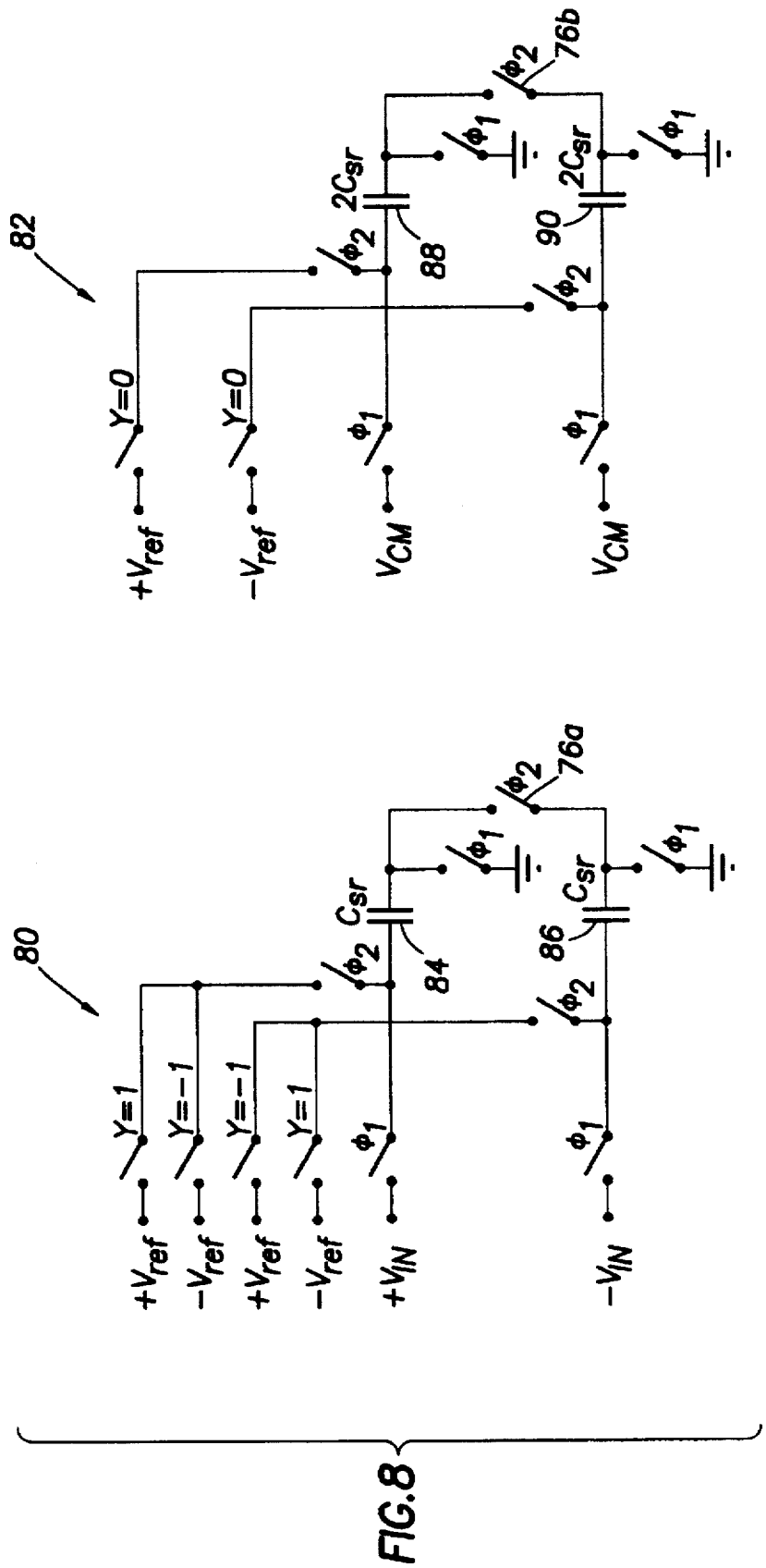
FIG 8 is a schematic diagram of load circuits used with the modulator of FIG. 7.

Turning now to FIGS. 6–8, various embodiments are shown of an A/D system. The system employs a modulator and a load circuit. The modulator and load circuit are used in conjunction so as to cancel any data dependent loading effects seen by reference voltages supplied to the modulator (as well as to the load circuit). The load circuit thereby serves to cancel data dependency problems and, more specifically, substantially eliminates ac components upon the reference supplies. Thus, a modulator hereof which uses the present load circuit is one which is less susceptible to passband noise imparted by data dependent $V_{ref}$ voltage skews.

FIG. 6 illustrates, according to one embodiment, a modulator 60 employed as part of an A/D system. Modulator 60 includes a switched capacitor network 62 and a fully differential integrator 64. It is known, however, that modulator 60 includes many other components, such as a quantizer similar to those of FIG. 1. For sake of brevity, components 62 and 64 are illustrated only to provide sufficient understanding as to benefits of the invention without unnecessarily confusing the description with items which do not directly pertain to that description.

FIG. 6 illustrates shared capacitors $C_s$ as reference numerals 66 and 68, and the benefits of having minimal number of capacitors and switches within network 62. A digital data value Y=1 causes $V_{ref}+$ to be subtracted from a pre-sampled $V_{in}-$ on capacitor 68 during the same time in which $V_{ref}-$ is subtracted from the pro-sampled $V_{in}+$ signal on shared capacitor 66. The charge provided from $V_{ref}+$ and $V_{ref}-$ to capacitors 66 and 68 during various data values Y=−1 and Y=1 are itemized as follows:

during $Y = -1$:
$V_{ref}^+$ provided charge: $Q_{66} = C_s (V_{ref}^+ - V_{in}^+)$ (Eq. 1)
$V_{ref}^-$ provided charge: $Q_{68} = C_s (V_{ref}^- - V_{in}^-)$ (Eq. 2)

during $Y = 1$:
$V_{ref}^+$ provided charge: $Q_{68} = C_s (V_{ref}^+ - V_{in}^-)$ (Eq. 3)
$V_{ref}^-$ provided charge: $Q_{66} = C_s (V_{ref}^- - V_{in}^+)$ (Eq. 4)

Looking solely at the modulator 60, equations 1 and 3 illustrates the charge provided from $V_{ref}+$ to capacitor 66 or 68, and therefore the loading of the reference voltage, is dependent upon $V_{in}$. Likewise, equations 2 and 4 indicate that the load on $V_{ref}-$ depends upon $V_{in}$.

Data dependent loading shown above, however, is compensated for by using a load circuit 70. Load circuit 70 is designed with shared capacitors $C_{sr}$ which match in value with capacitors $C_s$. Shared capacitors $C_{sr}$ are designated with reference numerals 72 and 74. Load circuit 70 is therefore identical to switched capacitor network 62, except for attribution of Y control signals to the reference voltages, and a shorting switch 76. The charge of load circuit 70 requires a discharging path at phase $\phi 2$ because it is not dumped to the integrator as in modulator 60. The easiest way to do this in a fully differential integrator is to provide a shorting switch 76 within load circuit 70 between the positive and negative polarity paths.

Load circuit 70 suffices to provide an offset charge load of equal magnitude and opposite plurality to the data dependent charge load produced by modulator 60 upon the reference supply voltages. Shared capacitors 72 and 74 produce the following load on $V_{ref}+$ and $V_{ref}-$ during states $Y=-1$ and $Y=1$:

during $Y = -1$:
$V_{ref}^+$ provided charge: $Q_{74} = C_{sr} (V_{ref}^+ - V_{in}^-)$ (Eq. 5)
$V_{ref}^-$ provided charge: $Q_{72} = C_{sr} (V_{ref}^- - V_{in}^+)$ (Eq. 6)

during $Y = 1$:
$V_{ref}^+$ provided charge: $Q_{74} = C_{sr} (V_{ref}^+ - V_{in}^+)$ (Eq. 7)
$V_{ref}^-$ provided charge: $Q_{72} = C_{sr} (V_{ref}^- - V_{in}^-)$ (Eq. 8)

Loading associated with shared capacitor $C_{sr}$ offsets the loading associated with capacitors $C_s$ as seen by reference combination of equations 1 and 5, 2 and 6, 4 and 7, and 3 and 8. The combination of those equations are presented as follows:

during $Y = -1$:
$Q_{TOTAL} = Q_{(66/74)} = 2C_s V_{ref}^+$ (Eq. 9)
$Q_{TOTAL} = Q_{(68/72)} = 2C_s V_{ref}^-$ (Eq. 10)

during $Y = 1$:
$Q_{TOTAL} = Q_{(66/74)} = 2C_s V_{ref}^-$ (Eq. 11)
$Q_{TOTAL} = Q_{(68/72)} = 2C_s V_{ref}^+$ (Eq. 12)

Noting that equations 9–12 as not having any dependency upon $V_{in}$ thereby affords substantial elimination of ac components upon the reference voltage supply of modulator 60. Elimination of the ac component, and the data dependency which causes that component, thereby produces a beneficial modulator 60, as shown.

Turning out of FIG. 7, an alternative embodiment of modulator 60a is presented. Modulator 60a comprises a switched capacitor network 62a which responds to three logic levels output from the quantizer. The logic levels are represented as $Y=-1$, $Y=1$ and $Y=0$. Except for the addition of the third level, modulator 60a is identical to modulator 60. The third level, $Y=0$ allows coupling of a common mode voltage supply in order to generate an analog level centered between $V_{ref}+$ and $V_{ref}-$. Similar to the two level quantizer output, the three output can be compensated to eliminate data dependency loading of $V_{in}$ upon the reference voltage supply. FIG. 8 indicates a pair of load circuits 80 and 82, which are to be used in conjunction with the embodiment shown in FIG. 7.

Load circuits 80 and 82 each comprise shared capacitors, denoted with numerals 84, 86, 88, and 90. Capacitors 84 and 86 are of equal value, and are equal to shared capacitors 92 and 94, respectively, shown in FIG. 7. Capacitors 88 and 90 are twice the size as capacitors 92 and 94, respectively.

Load circuit 80 functions to cancel the data dependency load of $V_{in}$ on $V_{ref}+$ during $Y=-1$ and $Y=1$ as follows:

during $Y = -1$:
$Q_{TOTAL(92/86)} = C_s (V_{ref}^+ - V_{in}^+) + C_{sr} (V_{ref}^+ - V_{in}^-)$ (Eq. 13)
$= 2C_s V_{ref}^+$ during $Y = 1$:
$Q_{TOTAL(94/84)} = C_s (V_{ref}^+ - V_{in}^-) + C_{sr} (V_{ref}^+ - V_{in}^+)$ (Eq. 14)
$= 2C_s V_{ref}^+$ As noted from the above, the total charge upon shared capacitors within modulator 60a and within load circuit 80 is not dependent upon $V_{in}$ due to the fact that $-V_{in}+$ cancels with $-V_{in}-$. For example, if $V_{in}$ is 5 volts, then $-V_{in}+$ is $-5$ volts and $-V_{in}-$ is $+5$ volts. Given that $C_s=C_{sr}$ then the total charges upon the shared capacitors are those given in equations 13 and 14, similar to those shown in equations 9–12.

Cancellation of data dependency load on $V_{ref}+$ during the third state, $Y=0$, is shown in reference to load circuit 82. During $Y=0$, cancellation occurs in accordance with the following equation 15:

during $Y = 0$:
$Q_{TOTAL(92/88)} = C_s(0) + 2C_s(V_{ref}^+ - V_{cm})$ (Eq. 15)
$= 2C_{sr} V_{ref}^+$ It is recognized that the common mode voltage $V_{cm}$, or ground, when combined with $V_{in}$, causes discharge of the sampled $V_{in}$. Accordingly, charge is removed from shared capacitors 92 and 94 when state $Y=0$ occurs during the second clock cycle $\phi 2$. Since $V_{cm}$ is $=0$, then equation 15 reduces to $2C_{sr}V_{ref}+$.

On each load circuit 70, 80 and 82, switch 76, 76a, and 76b, respectively, is provided. Switches 76 serve to provide a discharging path for capacitors at phase $\phi 2$. Alternatively, instead of connecting the right hand side of capacitors in both paths with one another, two separate switches can be used for each path. The separate switches can be used to individually draw associated charge to ground at the conclusion of $\phi 2$. Still further, according to yet another alternative embodiment, a duplicate fully differential integrator using a replica differential amplifier can be connected across switches 76.

It will be appreciated by those skilled in the art having the benefit of this disclosure that this invention is believed to be capable of applications with any modulator used within an A/D, preferably a delta-sigma modulator. Furthermore, it is also to be understood that the invention shown and described is to be taken as presently preferred embodiments. Various modifications and changes may be made to the modulator components in the load circuit so as to enhance the data dependency cancellation features set forth herein. Such modifications would be obvious to a person skilled in the art having the benefit of this disclosure. It is intended that the following claims be interpreted to embrace all such modifications and changes, accordingly, this specification and drawings are to be regarded in an illustrative rather than a restrictive sense.

What is claimed is:

1. An A/D system, comprising:
 a shared capacitor coupled to sample a first analog input voltage of first polarity during a first clock cycle and to sample a reference voltage during a second clock cycle subsequent to the first clock cycle;
 an integrator coupled to the shared capacitor for receiving the reference voltage and the sampled first analog input voltage during the second clock cycle; and
 a load circuit coupled to sample a second analog input voltage of second polarity opposite the first polarity during the first clock cycle, and wherein said load circuit samples said reference voltage during the second clock cycle in order to cancel loading of said first and second input voltages upon said reference voltage.

2. The A/D system as recited in claim 1, wherein said first and second analog input voltages are sampled at an oversampled rate.

3. The A/D system as recited in claim 1, wherein said first and second analog input voltages are sampled at more than twice the Nyquist sampling rate.

4. The A/D system as recited in claim 1, further comprising a D/A converter connected to receive a digital value within a data stream and, in response to said digital value, to select said reference voltage corresponding to said digital value.

5. The A/D system as recited in claim 4, wherein said digital value is one of two logic levels.

6. The A/D system as recited in claim 4, wherein said digital value is one of three logic levels.

7. The A/D system as recited in claim 1, wherein said shared capacitor is operably coupled to receive said first analog input voltage and said reference voltage during said first and second clock cycles, respectively.

8. The A/D system as recited in claim 1, comprising a delta-sigma modulator.

9. The A/D system as recited in claim 1, wherein said integrator comprises a differential amplifier having two differential inputs.

10. A delta-sigma modulator, comprising:
 an analog input voltage of positive polarity operably coupled to a shared capacitor of a delta-sigma modulator during a first clock cycle; and
 a reference voltage operably coupled to said shared capacitor and to a load circuit during a second clock cycle subsequent to said first clock cycle, wherein said load circuit places an offset charge upon said reference voltage to substantially cancel a data dependent charge imparted upon said reference voltage by said analog input voltage.

11. The delta-sigma modulator as recited in claim 10, wherein an analog input voltage of negative polarity is operably coupled to said load circuit during the first clock cycle.

12. The delta-sigma modulator as recited in claim 10, wherein said load circuit places an offset charge upon said reference voltage to substantially cancel a data dependent charge value imparted upon said reference voltage by a voltage which exists upon said shared capacitor prior to said second clock cycle.

13. The delta-sigma modulator as recited in claim 12, wherein one of said three reference voltages comprises a common-mode voltage.

14. The delta-sigma modulator as recited in claim 10, further comprising a D/A converter having an input coupled to receive a digital value within a one-bit data stream and, in response thereto, to select one of two reference voltages for coupling to said shared capacitor.

15. The delta-sigma modulator as recited in claim 10, further comprising a D/A converter having an input coupled to receive a digital value within a three level data stream and, in response thereto, to select one of three reference voltages for coupling to said shared capacitor.

16. The delta-sigma modulator as recited in claim 10, wherein cancellation of said data dependent charge causes said reference voltage not to change as a function of changes in said analog input voltage.

17. The delta-sigma modulator as recited in claim 10, wherein said offset charge is of equal magnitude and opposite polarity to the product of said shared capacitor and said analog input voltage.

18. The delta-sigma modulator as recited in claim 10, wherein said offset charge changes at the same rate and is of equal magnitude and opposite polarity to that of said analog input voltage.

19. A method for canceling input voltage data dependent loading upon a reference voltage supply, comprising:
 during a first clock cycle, forwarding a first input voltage upon a first capacitor within a first switched capacitor circuit while simultaneously forwarding a second input voltage upon a second capacitor within a second switched capacitor circuit; and
 during a second clock cycle subsequent to the first clock cycle, forwarding a reference voltage upon both said first capacitor and said second capacitor, whereby said first input voltage cancels said second input voltage to present a load upon the reference voltage which is not dependent upon either said first or second input voltage.

20. The method as recited in claim 19, wherein said second switched capacitor circuit comprises a load circuit.

21. The method as recited in claim 19, wherein said forwarding said reference voltage comprises selecting said reference voltage based upon a data value within a stream of data values.

22. The method as recited in claim 21, wherein said data value comprises one of two data values.

23. The method as recited in claim 21, wherein said data value comprises one of three data values.

24. The method as recited in claim 19, wherein said first switched capacitor circuit comprises a portion of a modulator.

25. The method as recited in claim 19, wherein said first switched capacitor circuit is used in an integrator function.

26. The method as recited in claim 19, wherein said first input voltage is of a first polarity, and wherein said second input voltage is of a second polarity.

27. The method as recited in claim 26, wherein said first and second polarity values are represented as positive and negative voltage values of substantially equal magnitude.

* * * * *